United States Patent
Bae et al.

(10) Patent No.: US 6,380,688 B1
(45) Date of Patent: Apr. 30, 2002

(54) ELECTRO-LUMINESCENCE DISPLAY WITH DIVIDED POWER SUPPLY LINES

(75) Inventors: Sung Joon Bae, Kyunggi-do; Jae Yoon Lee; Jae Yong Park, both of Seoul; Woong Sik Choi, Kyunggi-Do, all of (KR)

(73) Assignee: LG Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/637,696

(22) Filed: Aug. 15, 2000

(30) Foreign Application Priority Data

Aug. 16, 1999 (KR) ............................. P99-33688

(51) Int. Cl.[7] ................................. G09G 3/10
(52) U.S. Cl. ...................... 315/169.3; 345/60
(58) Field of Search ............. 315/169.1–169.4; 345/76–78, 210–214, 55–60

(56) References Cited

U.S. PATENT DOCUMENTS

| | | | | |
|---|---|---|---|---|
| 5,990,629 A | * | 11/1999 | Yamada et al. | 315/169.3 |
| 6,064,158 A | * | 5/2000 | Kishita et al. | 315/169.3 |
| 6,154,187 A | * | 11/2000 | Kim | 345/60 |
| 6,271,812 B1 | * | 8/2001 | Osada et al. | 315/169.3 |

* cited by examiner

*Primary Examiner*—Don Wong
*Assistant Examiner*—Wilson Lee
(74) *Attorney, Agent, or Firm*—Birch, Stewart, Kolasch & Birch, LLP

(57) ABSTRACT

An electro-luminescence display (ELD) wherein a voltage supply line is separated into a plurality of lines to reduce the number of pixels connected to each line. In the ELD, a pixel array has a number of pixels, each of which includes an electro-luminescence device having a luminescent layer made from an-electro-luminescent material, an anode electrode and a cathode electrode serving as a common electrode. The pixel array is arranged in an active matrix type. A gate driving circuit and a data driving circuit are connected, via a number of scanning electrode wiring and a number of data electrode wiring, respectively, to the pixel array, for switching the pixels to selectively drive the pixels. First and second supply voltages are applied from an external circuit to the first and second supply terminals. First and second power supply lines couple the first and second voltage supply terminals with the pixel array. The pixels within the array are divided into blocks and pixels within a block are all connected to a supply line for that block. Accordingly, excessive current is not generated, which prevents head damage to the ELD and thus improves reliability.

16 Claims, 4 Drawing Sheets

US 6,380,688 B1

ELECTRO-LUMINESCENCE DISPLAY WITH DIVIDED POWER SUPPLY LINES

BACKGROUND OF THE INVENTION

1. Field of the Invention

This invention relates to an electro-luminescence display (ELD), and more particularly to an ELD wherein a voltage supply line is divided into a plurality of voltage supply lines, and thereby reduce the number of pixels connected to each voltage supply line.

2. Description of the Related Art

An ELD is a device that is luminous by recombining electrons injected from an external source to a luminescent layer. The luminescent layer can be made from electro-luminescent (EL) materials with holes.

Because the ELD is luminous by the recombination of the injected electrons and holes, a back light is not required. This permits a display panel to be thinner and allows power consumption to remain low.

As a result, ELD has been the subject of growing interest in the field of displays. In particular, an organic ELD, in which the luminescent layer is formed from organic EL materials has received attention due to its advantages. The advantages include requiring a low driving voltage, having a high luminous efficiency, and allowing manufacture by a low temperature process.

typical active ELD has a number of scanning electrode lines crossing a number of data electrode lines. The ELD also includes a number of pixels, each of which is formed at the crossing. A voltage supply line is also supplied to each pixel, and the voltage supply lines are insulated from both the scanning electrode and data electrode lines. Each pixel includes a switching device comprising a thin film transistor (TFT), a driver, a storage capacitor, and an EL device.

FIG. 1 is a circuit diagram of a pixel array of a conventional ELD. In FIG. 1, the active matrix array has M×N pixels 10, where M and N are integers. Each pixel 10 includes a switching transistor $Q_s$, a driving transistor $Q_d$, a capacitor C, and an EL device $E_d$.

A gate of the switching transistor $Q_s$ is connected to a scanning electrode line 12 and a source of $Q_s$ is connected to a data electrode line 14. A drain of $Q_s$ is connected to a gate of the driving transistor $Q_d$. A source of $Q_d$ is connected to a first voltage supply $V_{dd}$ via a first power supply line 16, and a drain of $Q_d$ is connected to an anode of the EL device $E_d$.

A cathode of the EL device $E_d$ is connected to a second voltage supply $V_{ss}$ via a second power supply line 18. It should be noted that all connections to $V_{ss}$ are common to all EL devices $E_d$. The EL device $E_d$ includes at least one luminescent layer (not shown) made from an organic EL material, between the anode and the cathode.

Finally, the capacitor C is connected between the gate and the source of the driving transistor $Q_d$ as shown.

operation of the conventional ELD having the configuration as shown in FIG. 1 is as follows. A desired row of pixels is selected by applying a signal to a corresponding scanning electrode line 12. This applies a voltage to the gates of the desired switching transistors $Q_s$ to turn on the selected switching transistors $Q_s$.

Then a desired pixel 10 is selected by applying a signal to a corresponding data electrode line 14. This applies a voltage to the gate of the desired driving transistor $Q_d$ to turn on the selected driving transistor $Q_s$.

When the driving transistor is turned on, current is allowed to flow between the first and second voltage supplies $V_{dd}$ and $V_{ss}$ through the EL device $E_d$. This in turn allows the EL device $E_d$ to become luminous by the recombination of electrons and holes in the luminescent layer.

The capacitor C maintains the data signal level until the next time the data signal is applied.

FIG. 2 is a schematic diagram of the conventional ELD. The conventional ELD includes a pixel array 20, a data driving circuit 21, a gate driving circuit 23, first and second voltage supply terminals 25 and 27, and first and second power supply lines 29 and 31.

The pixel array 20 has the configuration as shown in FIG. 1. The array 20 is arranged to be electrically connected to the data driving circuit 21 and the gate driving circuit 23 at the periphery thereof (not shown). The data driving circuit 21 and the gate driving circuit 23 are connected to the data electrode lines 14 and the scanning electrode lines 12, respectively, which are in turn connected to the pixel array 20, as shown in FIG. 1.

The first and second voltage supplies $V_{dd}$ and $V_{ss}$ are applied to the first and second voltage supply terminals 25 and 27, respectively, which are in turn connected to the first and second power supply lines 29 and 31, respectively, as shown in FIG. 2. And as shown in FIG. 1, the first and second power supply lines are connected to each pixel 10 of the pixel array 20. It should be noted again that the cathodes of EL devices $E_d$ serve as a common electrode.

When a particular pixel 10 of the conventional ELD is driven, the pixel 10 receives the first and second supply voltages $V_{dd}$ and $V_{ss}$ through the first and second voltage supply terminals 25 and 27, respectively. As a result, current flows through the first and second power supply lines 29 and 31, again respectively. Only a minute amount of current is required to make the pixel 10 luminous.

However, the conventional ELD suffers from at least the following problem. Even though each pixel requires a small amount of current, the sum of current required to drive all pixels can be significant. It can be significant enough to generate significant amounts of heat and thus to melt the supply lines and damage the luminescent layers of the pixels. In both cases, the reliability of the ELD is compromised. This problem becomes more acute as the ELD becomes larger and as the resolution of the display is increased.

SUMMARY OF THE INVENTION

Accordingly, is an object of the present invention to provide an electro-luminescence display capable of preventing or minimizing heat generation caused by a current flowing through the first and second power supply lines, and thereby improve its reliability.

To achieve these and other objects of the invention, an electro-luminescence display according to an embodiment of the present invention includes a pixel array having a number of pixels. Each pixel includes an electro-luminescence device having a luminescent layer made from an electro-luminescent material. The electro-luminescence device also includes an anode electrode and a cathode electrode serving as a common electrode for the ELD. The ELD may be an active matrix type.

The display also includes a gate driving circuit and the data driving circuit, being connected, via a plurality of scanning electrode lines and a plurality of data electrode lines, respectively, to the pixel array, to selectively drive each pixel.

The display further includes first and second voltage supply terminals to which first and second supply voltages are applied, from an external circuit for example. First and second power supply lines couple the first and second voltage supply terminals with the pixel array.

Each first power supply line supplies a subset of the pixels with the first supply voltage. Likewise, each second power supply line supplies another subset of the pixels with the second supply voltage.

BRIEF DESCRIPTION OF THE DRAWINGS

These and other objects of the invention will be apparent from the following detailed description of the embodiment of the present invention with reference to the accompanying drawings, in which.

DETAILED DESCRIPTION OF THE PREFERRED EMBODIMENTS

Figure 1:
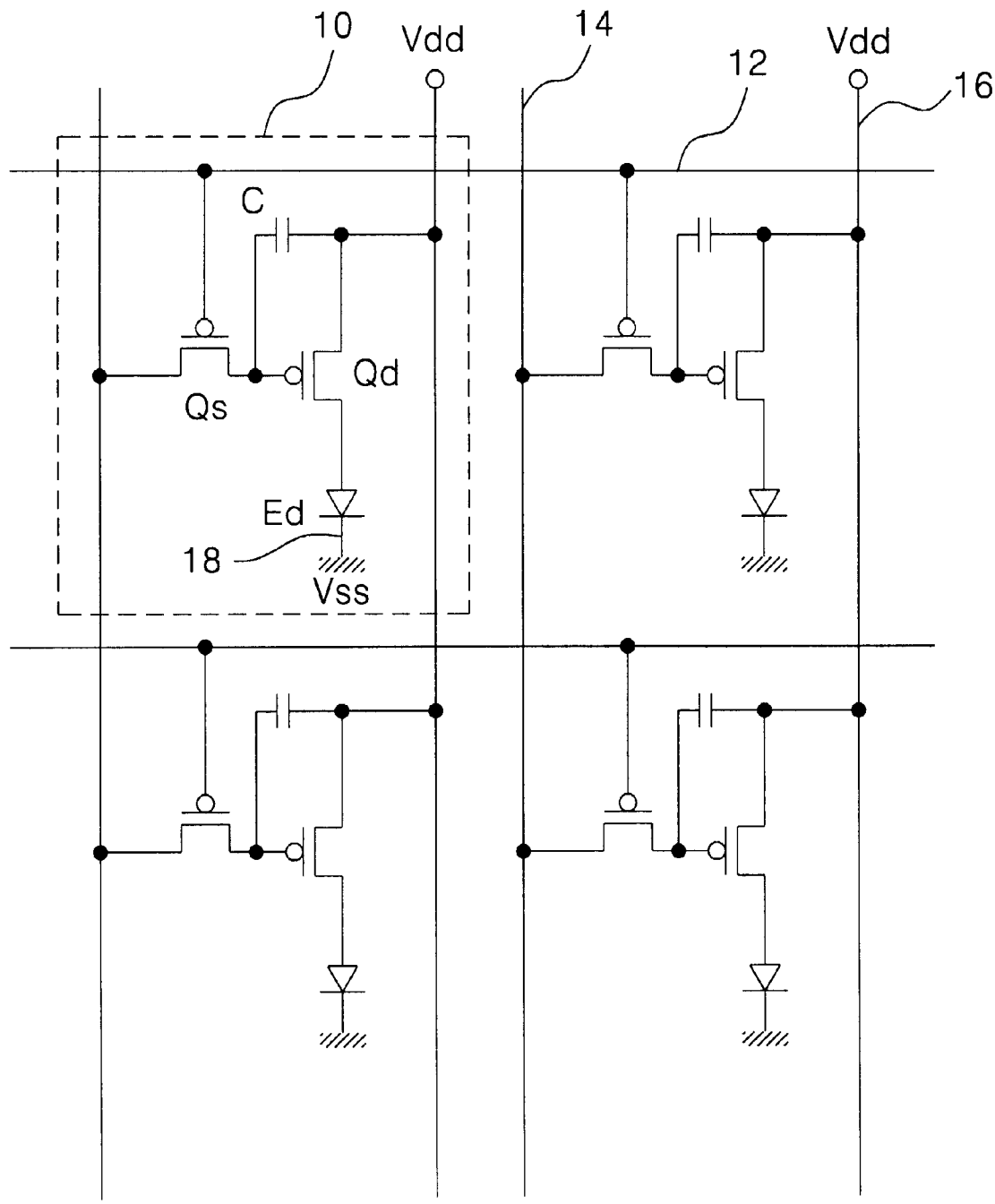
FIG. 1 is a circuit diagram of a pixel array in a conventional electro-luminescence display.
Figure 2:
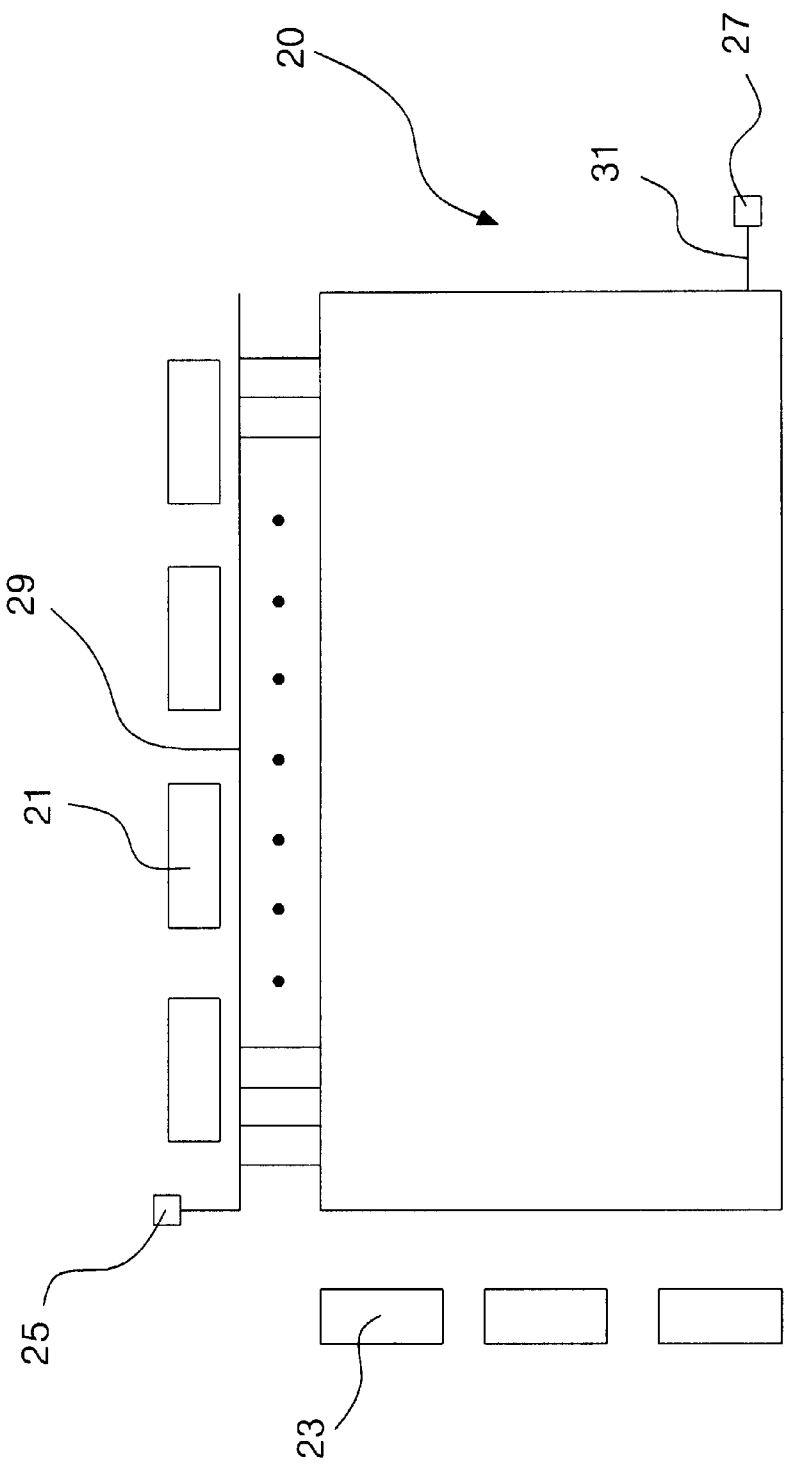
FIG. 2 is a schematic diagram showing a configuration of the conventional electro-luminescence display.
Figure 4:
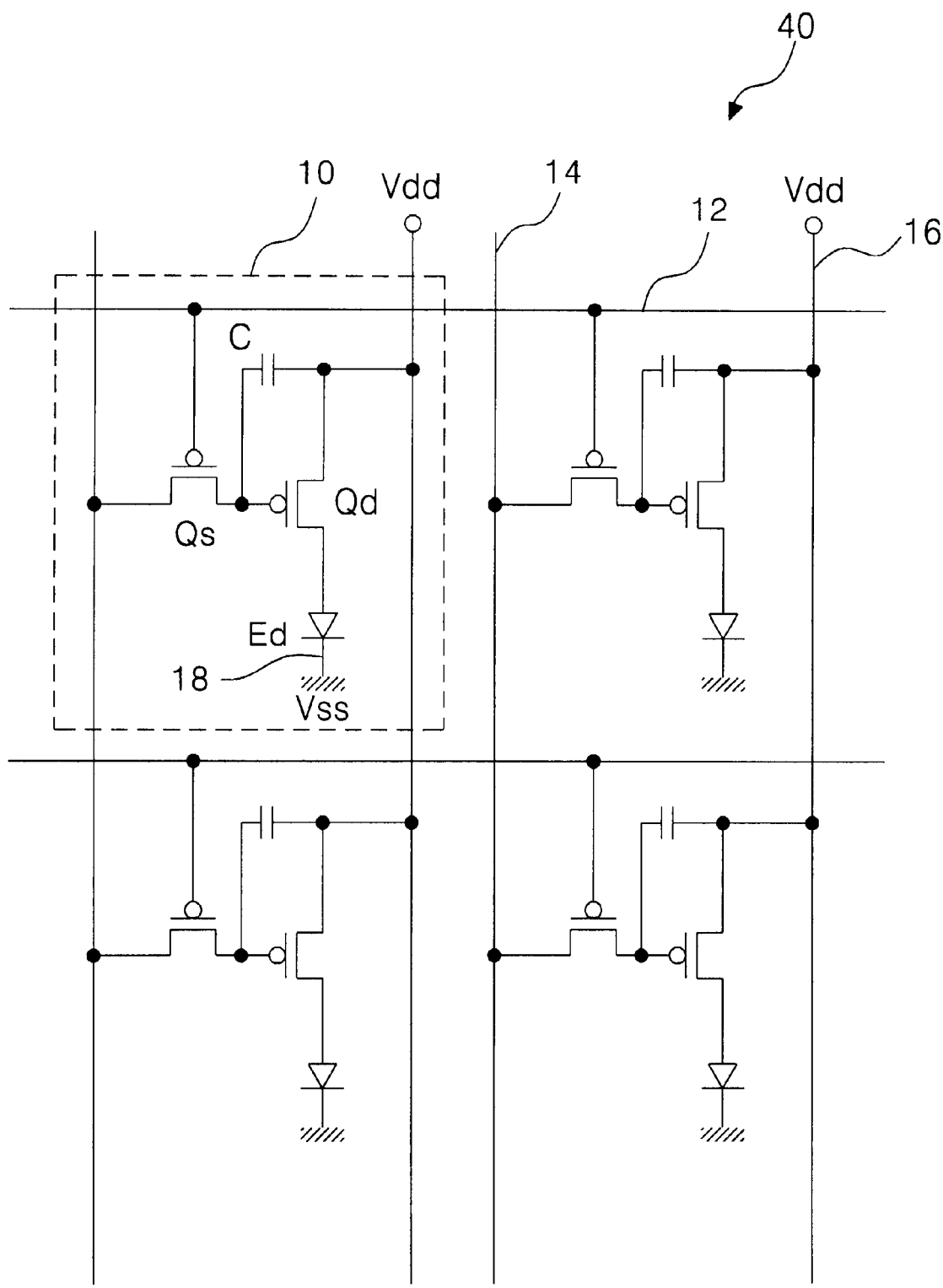
FIG. 4 is a circuit diagram of a pixel array of FIG. 3 according to an embodiment of the present invention.

The pixel array 40 has the configuration and operation as shown in FIG. 4 which is identical to the pixel array configuration shown in FIG. 1. Thus, a detailed discussion of the elements and operation of the pixel array 40 will be omitted.

Returning to FIG. 3, the array 40 is arranged to be electrically connected to the data driving circuit 41 and the gate driving circuit 43 at the periphery of the pixel array 40. The data driving circuit 41 and the gate driving circuit 43 are connected to the data electrode lines 14 and the scanning electric lines 12, respectively, which are in turn connected to the pixel array 40, as shown in FIG. 4.

Figure 3:
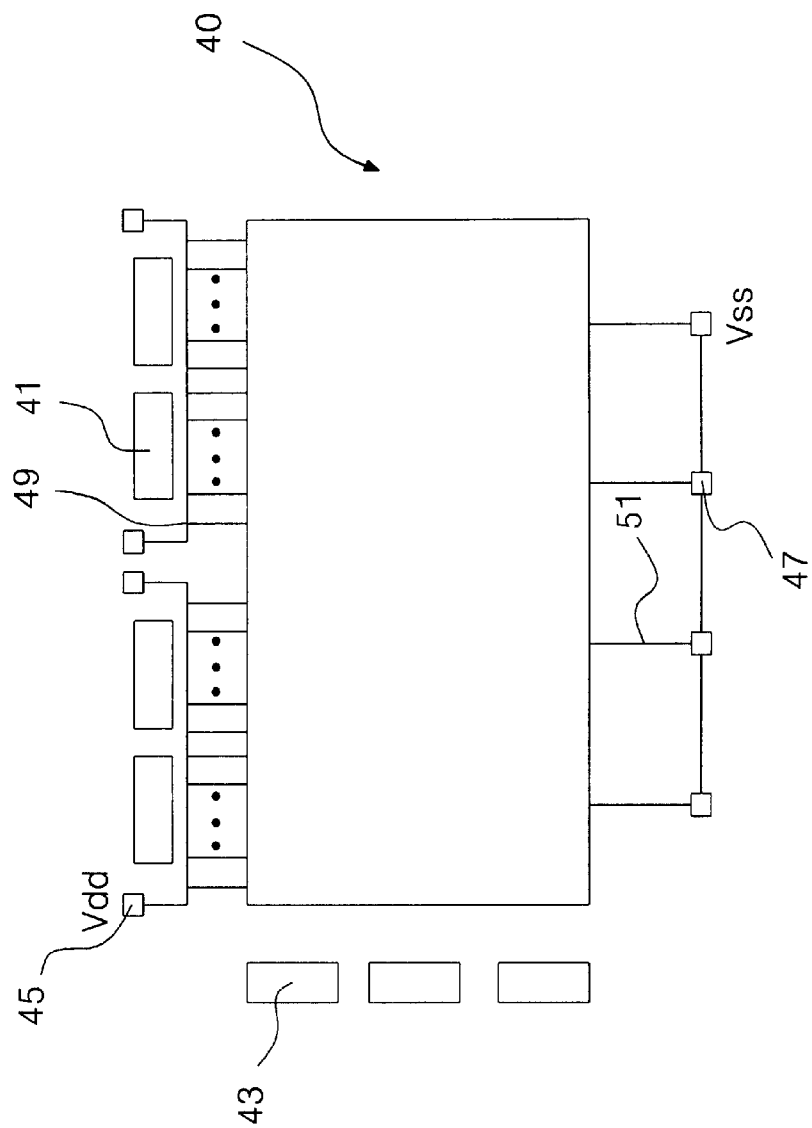
FIG. 3 is a schematic diagram showing a configuration of an electro-luminescence display according to an embodiment of the present invention.

FIG. 3 is a schematic diagram of an ELD according to an embodiment of the present invention. The ELD includes a pixel array 40, a data driving circuit 41, a gate driving circuit 43, a plurality of first voltage supply terminals 45, a plurality of second voltage supply terminals 47, a plurality of first power supply lines 49, and a plurality of second power supply lines 51.

The first and second voltage supplies $V_{dd}$ and $V_{ss}$ are applied to the plurality of first and to the plurality of second voltage supply terminals 45 and 47, respectively. As can be seen from FIG. 3, an X number of first voltage supply terminals 45, wherein X is an integer, are connected to the first voltage supply $V_{dd}$ via an X number of first power supply lines 49. The X number of first power supply lines 49 are in turn connected to the pixel cell array 40. In other words, the pixel cell array 40 is divided into X blocks with each block being connected to a particular first voltage supply terminal 45 via a corresponding first power supply line 49.

Likewise, a Y number of second voltage supply terminals 47, wherein Y is an integer, are connected to the second voltage supply $V_{ss}$ via a Y number of second power supply lines 51. The Y number of second power supply lines 51 are in turn connected to the pixel cell array 40. It should be noted that the Y number of second voltage supply terminals 47 are connected to the common electrode of the pixel cell array 40, i.e., the cathodes of the EL devices $E_d$ serving as the common electrode, as sohwun in FIG. 4.

When a particular pixel 10 of the ELD as embodied in FIG. 3 is driven, the pixel 10 receives the first and second supply voltages $V_{dd}$ and $V_{ss}$ through one of the first voltage supply terminals 45 and one of the second voltage supply terminals 47, respectively. As a result, current flows through the corresponding first and second power supply lines 49 and 51, again respectively. Again, only a minute amount of current is required to make the pixel 10 luminous.

However, the pixels are divided into X blocks to receive the first supply voltage $V_{dd}$ through X first voltage supply terminals 45 and X first power supply lines 49. Thus, the number of pixels connected to each first voltage supply terminal 45 and each first power supply line 49 is reduced by a factor of X. This leads to a corresponding reduction of current flowing through each first voltage supply terminal and first power supply line 45 and 49, namely, by a factor of X.

Likewise, the amount of current flowing through each second voltage supply terminal 47 and second power supply line 51 is reduced by a factor of Y as well.

As a result, excessive current conduction by any single supply line is eliminated or minimized. This in turn prevents heat generation and subsequent damage to the luminescent layers of the pixels, and thereby improves the reliability of the ELD. This allows for the manufacture of larger ELDs and ELDs with higher resolution.

AS Described above, according to present invention, the pixel cell array is divided into a number of blocks, each of which is connected to the corresponding first power supply line and corresponding second power supply line, so that an amount flowing through each of the first and second power supply lines is reduced.

Accordingly, the ELD of the present invention prevents excessive current flowing through the first and second power supply lines, which in turn prevents heat damage to the luminescent layers. This improves the overall reliability of the ELD.

Although the present invention has been explained by the embodiments shown in the drawings described above, it should be understood to the ordinary skilled person in the art that the invention is not limited to the embodiments. Rather, various changes or modifications thereof are possible without departing from the spirit of the invention. Accordingly, the scope of the invention shall be determined by the claims and their equivalents.

What is claimed is:

1. An electro-luminescence display, comprising:

a pixel array having a number of pixels, each pixel including an electro-luminescence device having a luminescent layer, the electro-luminescence device including an anode electrode and a cathode electrode serving as a common electrode;

a gate driving circuit and a data driving circuit, being connected, via a plurality of scanning electrode lines and a plurality of data electrode lines, respectively, to the pixel array, to selectively drive the pixels; first and second voltage supply terminals to which first and second supply voltages are applied; and first and second power supply lines for coupling the first and second voltage supply terminals with the pixel array, wherein the first power supply line is divided into a plurality of first power lines and the pixels are divided into a plurality of blocks corresponding to the plurality of first power lines such that each first power line is connected to one block of pixels.

2. The electro-luminescence display according to claim 1, wherein said second power supply line is divided into a plurality of lines.

3. An electro-luminescence display (ELD), comprising:
a pixel array including a plurality of pixels organized into at least two subsets thereof;
a gate driving circuit electrically connected to each pixel of said pixel array, said gate driving circuit providing a row-select signal to select a row of said pixels within said pixel array;
a data driving circuit electrically connected to each pixel of said pixel array, said data driving circuit providing a cell-select signal to select a pixel among said selected row of pixels;
a plurality of first voltage supply lines electrically connected to a first voltage source supplying a first voltage, a first one of said plurality of first voltage supply lines also being connected to a first subset of said pixels and a second one of said plurality of first voltage supply lines also being connected to a second subset of said pixels different than said first subset of said pixels; and
a plurality of second voltage supply lines electrically connected to a second voltage source supplying a second voltage, a first one of said plurality of second voltage supply lines also being connected to said first subset of said pixels and a second one of said plurality of second voltage supply lines also being connected to said second subset of said pixels.

4. The ELD of claim 3, wherein said pixel comprises:
a switching transistor responding to said row-select signal;
a driving transistor connected to said switching transistor and electrically connected to said first voltage source, said driving transistor responding to said cell-select signal when said switching transistor has responded to said row-select signal such that said first voltage is supplied to said pixel when said cell is selected;
an electro-luminescence device connected to said driving transistor, said electro-luminescent device being electrically connected to said second voltage source such that said first and second voltage sources are electrically connected through said driving transistor and said electro-luminescence device when said driving transistor responds; and
a capacitor to hold a cell information between responses to said cell-select signals.

5. The ELD of claim 4, wherein said electro-luminescence device is made of organic electro-luminescent material.

6. The ELD of claim 4, wherein a gate of said switching transistor is electrically connected to said row-select signal, a source of said switching transistor is electrically connected to said cell-select signal, a drain of said switching signal is connected to a gate of said driving transistor and to a first terminal of said capacitor, a source of said driving transistor and a second terminal of said capacitor are electrically connected to said first voltage source, a drain of said driving terminal is connected to an anode of said electro-luminescent device, and a cathode of said electro-luminescent device is electrically connected to said second voltage source.

7. The ELD of claim 3, further comprising a plurality of scanning electrode lines, said scanning electrode lines carrying said row-select signal from said gate driving circuit to said pixels.

8. The ELD of claim 3, further comprising a plurality of data electrode lines, said data electrode lines carrying said cell-select signal from said data driving circuit to said pixels.

9. The ELD of claim 3, wherein said ELD is an active matrix type ELD.

10. The ELD of claim 1, wherein the luminescent layer is made of an organic electro-luminescent material.

11. The ELD of claim 1, wherein the display is an active matrix type.

12. An electro-luminescence display (ELD), comprising:
a pixel array including a plurality of pixels organized into at least two subsets thereof;
a gate driving circuit electrically connected to each pixel of said pixel array, said gate driving circuit providing a row-select signal to select a row of said pixels within said pixel array;
a data driving circuit electrically connected to each pixel of said pixel array, said data driving circuit providing a cell-select signal to select a pixel among said selected row of said pixels; and
a plurality of first voltage supply lines electrically connected to a first voltage source supplying a first voltage, a first one of said plurality of first voltage supply lines also being connected to a first subset of said pixels and a second one of said plurality of first voltage supply lines also being connected to a second subset of said pixels different than said first subset of said pixels,
wherein said pixel includes,
a switching transistor responding to said row-select signal;
a driving transistor connected to said switching transistor and electrically connected to said first voltage source, said driving transistor responding to said cell-select signal when said switching transistor has responded to said row-select signal such that said first voltage is supplied to said pixel when said cell is selected;
an electro-luminescence device connected to said driving transistor, said electro-luminescent device being electrically connected to said second voltage source such that said first and second voltage sources are electrically connected through said driving transistor and said electro-luminescence device when said driving transistor responds; and
a capacitor to hold a cell information between responses to said cell-select signals.

13. A power supply circuit for an electro-luminescence display including a pixel array having a plurality of pixels and driving circuits for selectively driving the pixels, the power supply circuit comprising:
first and second voltage supply terminals to which first and second supply voltages are applied; and
first and second power supply lines for coupling the first and second voltage supply terminals with the pixel array,
wherein the first power supply line is divided into a plurality of first power lines and the pixels are divided into a plurality of first blocks corresponding to the plurality of first power lines such that each first power line is connected to one first block of pixels.

14. The power supply circuit according to claim 13, wherein the second power supply line is divided into a plurality of second power lines and the pixels are divided into a plurality of second blocks corresponding to the plurality of second power lines such that each second power line is connected to one second block of pixels.

15. The power supply circuit according to claim 13, wherein the second power supply line is divided into a plurality of second power lines corresponding to the plurality of first blocks of the pixels such that each second power line is connected to one first block of pixels.

16. A power supply circuit for an electro-luminescence display including a pixel array having a plurality of pixels and driving circuits for selectively driving the pixels, the power supply circuit comprising:

a plurality of first voltage supply lines electrically connected to a first voltage source supplying a first voltage, a first one of the said plurality of first voltage supply lines being connected to a first subset of the pixels, a second one of said plurality of first voltage supply lines being connected to a second subset of the pixels different than the first subset of the pixels; and a plurality of second voltage supply lines electrically connected to a second voltage source supplying a second voltage, a first one of said plurality of second voltage supply lines being connected to the first subset of the pixels, a second one of said plurality of second voltage supply lines being connected to the second subset of the pixels.

\* \* \* \* \*